United States Patent
Huang et al.

(10) Patent No.: US 6,673,720 B2
(45) Date of Patent: Jan. 6, 2004

(54) METHOD FOR IMPROVING THE RELIABILITY OF FLASH MEMORIES

(75) Inventors: Weng-Hsing Huang, Hsin-Chu (TW); Kent Kuohua Chang, Taipei (TW)

(73) Assignee: Macronix International Co. Ltd., Hsin-Chu (TW)

( * ) Notice: Subject to any disclaimer, the term of this patent is extended or adjusted under 35 U.S.C. 154(b) by 0 days.

(21) Appl. No.: 09/683,850

(22) Filed: Feb. 22, 2002

(65) Prior Publication Data

US 2003/0160241 A1 Aug. 28, 2003

(51) Int. Cl.[7] ............................................. H01L 21/211
(52) U.S. Cl. ...................... 438/700; 438/266; 438/709; 438/719
(58) Field of Search .................. 438/266, 700, 438/709, 719

(56) References Cited

U.S. PATENT DOCUMENTS

| | | | | |
|---|---|---|---|---|
| 6,232,185 B1 | * | 5/2001 | Wang | 438/266 |
| 6,326,213 B1 | * | 12/2001 | Letcher et al. | 436/518 |
| 6,387,814 B1 | * | 5/2002 | Chen | 438/700 |
| 2002/0080659 A1 | * | 6/2002 | Shin et al. | 365/200 |
| 2002/0149050 A1 | * | 10/2002 | Fazio et al. | 257/314 |

* cited by examiner

*Primary Examiner*—David Nelms
*Assistant Examiner*—Dao H. Nguyen
(74) *Attorney, Agent, or Firm*—Winston Hsu (57) ABSTRACT

A method for reducing random bit failures of flash memory fabrication processes with an HTO film. The random bit failures are caused by HF acid penetration. The HTO film, which functions as an interface reinforcement layer, is formed on a sacrificial layer and a PL1 layer. With the aid of the HTO film, the flash memory is free of acid-corroded seams.

7 Claims, 12 Drawing Sheets

METHOD FOR IMPROVING THE RELIABILITY OF FLASH MEMORIES

BACKGROUND OF INVENTION

1. Field of the Invention

The present invention relates to a method for improving the reliability of flash memories, and more particularly, to using a HTO film to reduce a random bit failure in a fabricating process to improve the reliability of flash memory.

2. Background of the Invention

For the past few years, there has been an increasing demand for portable electronic products, such as memories for digital cameras, mobile phones, video game apparatuses, personal digital assistants (PDA), MP3 players, etc. Such demand pushes the development of flash memory fabrication technology. Because of its highly reduced weight and physical dimensions compared to magnetic memories, such as hard disk or floppy disk memories, flash memory has a tremendous potential in the consumer electronics market.

Flash memory is typically designed having a stacked-gate or split-gate structure. The stacked-gate comprises a floating gate for storing charges, an oxide-nitride-oxide (ONO) dielectric layer, and a control gate for reading and writing of the data. Like a capacitor storing data, the memory stores charges in the stacked-gate to represent "1" data and erases the charges from the stacked-gate to represent "0" data. Additionally, the data stored in the memory is renewed through applying an extra energy to the stacked-gate.

Figure 1:
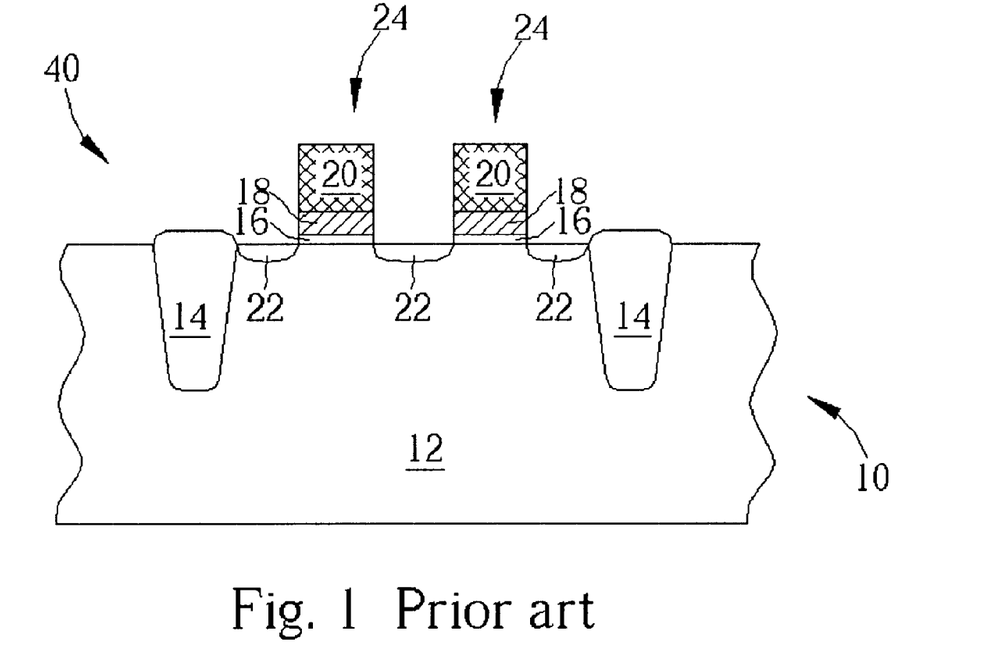
FIG. 1 to FIG. 7 are cross-sectional diagrams of forming a stacked-gate flash memory according to a prior art method.

Please refer to FIG. 1 to FIG. 7. FIG. 1 to FIG. 7 are cross-sectional diagrams of forming a dual-bit stacked-gate flash memory cell according to the prior art. As shown in FIG. 1, a semiconductor wafer 10 comprises a silicon substrate 12, an active area isolated by shallow trench structures 14 positioned on the silicon substrate 12, and two gate structures 24 positioned within the active area on the silicon substrate 12. Each gate structure 24 comprises a gate oxide layer 1 6 formed on the silicon substrate 12, a polysilicon layer (hereafter referred to as a PL1 layer) 18 positioned on the gate oxide layer 16, and a silicon nitride layer 20 positioned atop the PL1 layer 18. An ion implantation process is performed to implant ions into a region of the surface of the silicon substrate 12 that is not covered by the gate structure 24, i.e. into a bit line region. A thermal oxidation process is then performed to activate the doping ions to form a diffusion layer 22 that serves as a buried drain or source (BD/BS), or a bit line. A thermal oxide layer or BD/BS oxide layer growth step over the diffusion layer 22 then follows.

Figure 2:
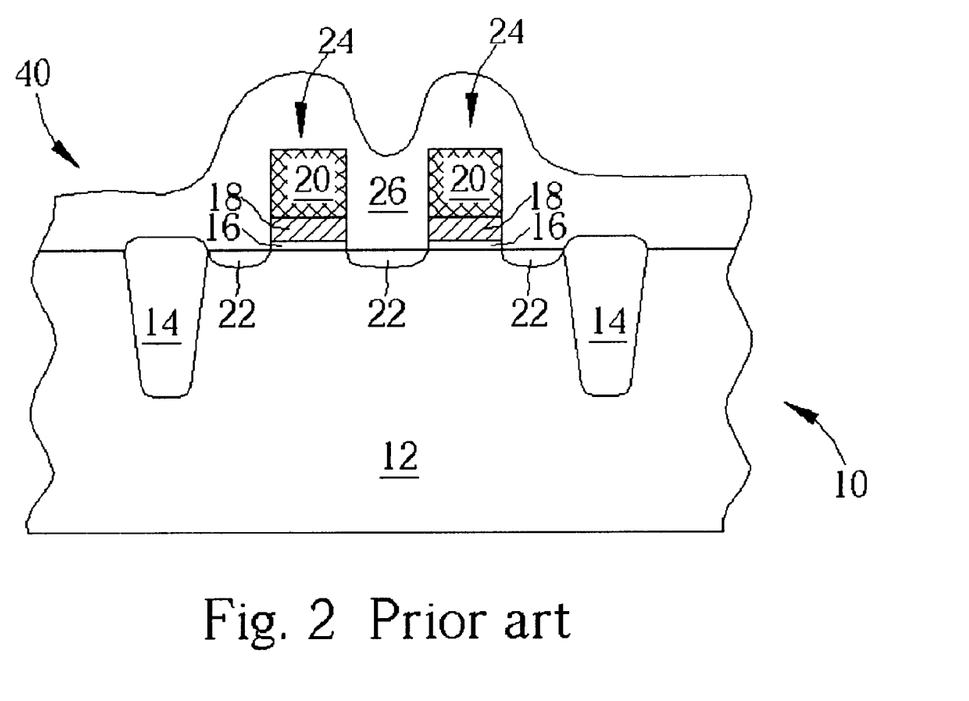

As shown in FIG. 2, a dielectric layer 26 is formed of silicon oxide on the surface of the semiconductor wafer 10 by performing an HDP CVD (high density plasma chemical vapor deposition) process. The dielectric layer 26 covers the surface of the substrate 12 and the gate structures 24. The top of a region of the dielectric layer 26 covering the substrate is higher than the top of the PL1 layer 18 but lower than the top of the silicon nitride layer 20.

Figure 3:
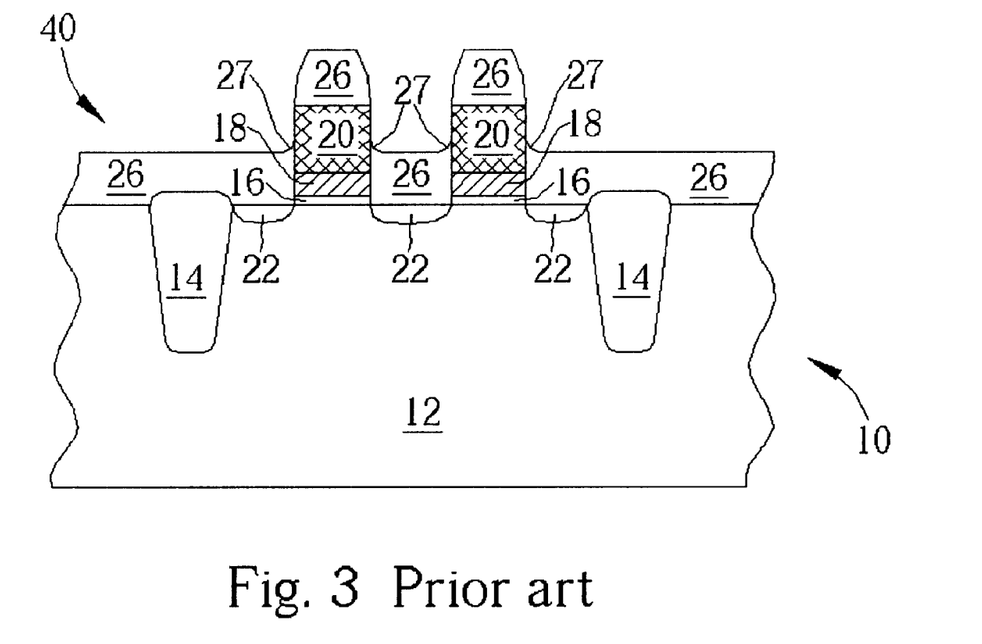

As shown in FIG. 3, a wet etching process is performed with DHF (diluted HF) or BOE (buffered oxide etcher). The dielectric layer 26 is removed in a range of several hundred angstroms to expose the protrusion structure 27.

Figure 4:
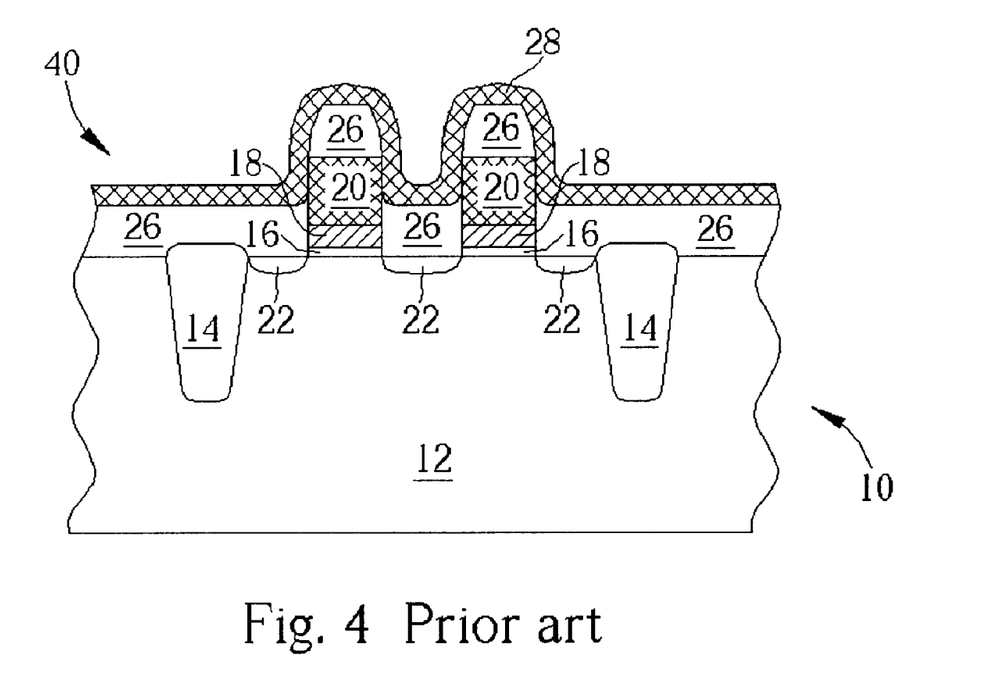
Figure 5:
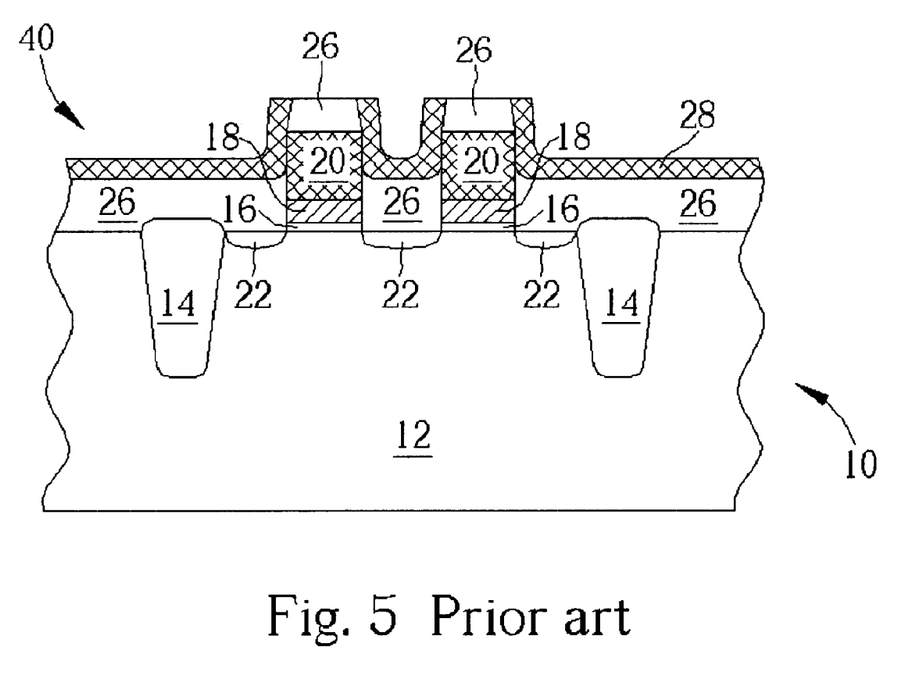
Figure 6:
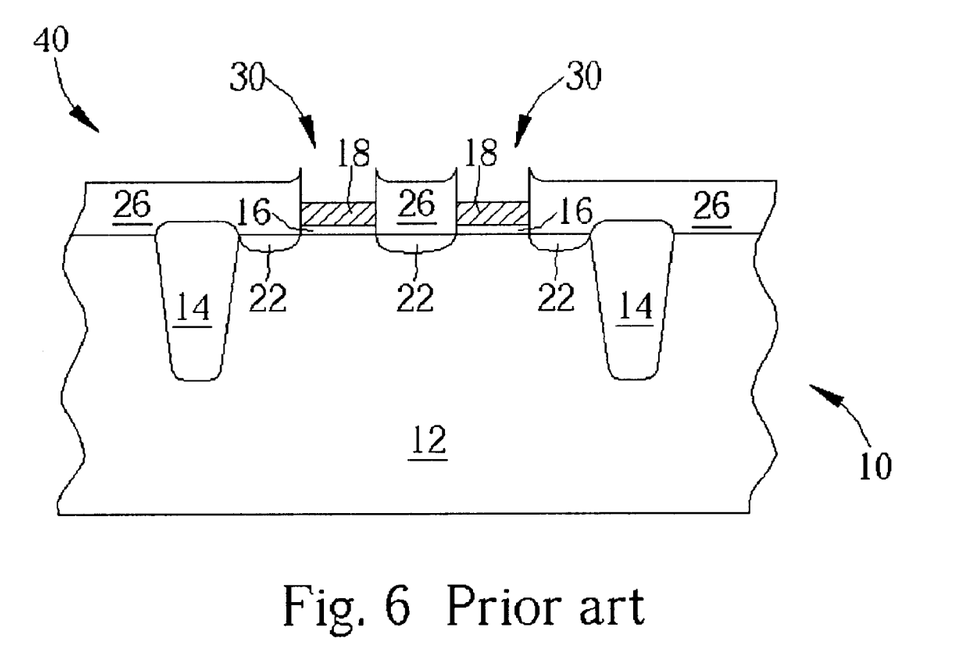

As shown in FIG. 4, a sacrificial layer 28 is formed of silicon nitride on the surface of the dielectric layer 26 and adjacent to the lateral of silicon nitride 20. Next, as shown in FIG. 5, a CMP (chemical mechanical polishing) process is performed to remove the sacrificial layer 28 and dielectric layer 26 on the silicon nitride 20 to a predetermined thickness. Next, as shown in FIG. 6, the dielectric layer 26 on the silicon nitride is removed. Then a wet etching process is performed with heated phosphoric acid solution to totally remove the sacrificial layer 28 and the silicon nitride 20 on the polysilicon layer 18. A recess 30 is formed with the top of the polysilicon layer 18 and the adjacent dielectric layer 26.

Figure 7:
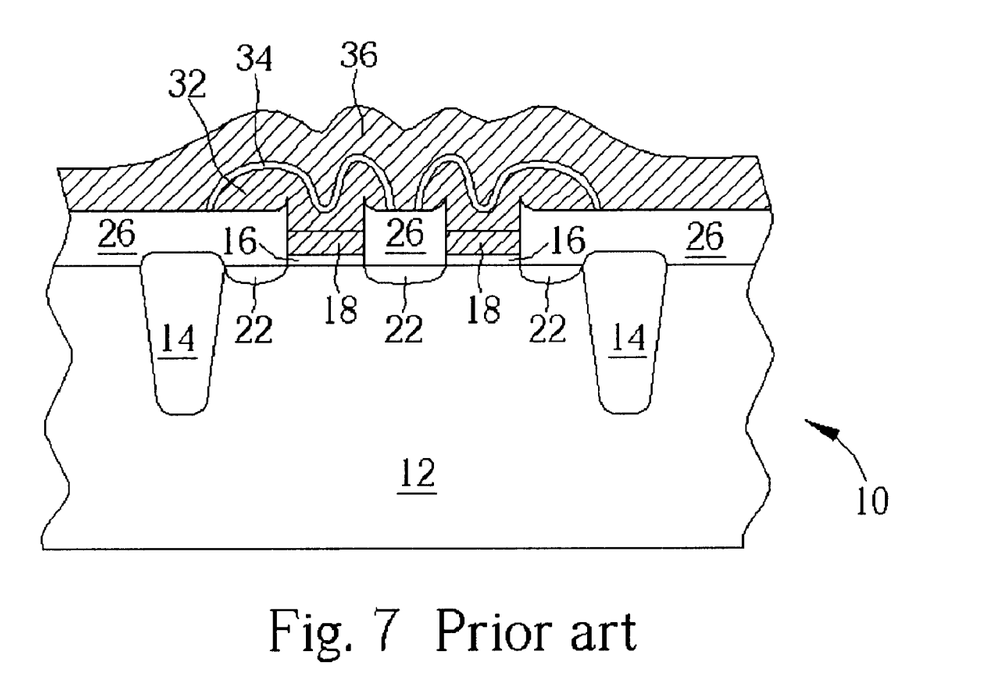

As shown in FIG. 7, a polysilicon layer 32 is formed on the surface of the semiconductor wafer 10 and the recess 30 is filled. The polysilicon layer 32 is electrically connected to the polysilicon layer 18 to form a floating gate of the flash memory. Then a dielectric layer 34 of ONO structure is formed. The dielectric layer 34 comprises a first oxide layer (not shown), a nitride layer (not shown) positioned on the first oxide layer, and a second oxide layer (not shown) positioned on the nitride layer. After that, a polysilicon layer 36 is formed on the semiconductor wafer 10 to cover the dielectric layer 26 and 34 as a control gate of the stacked-gate flash memory cell.

The process in the prior art uses a CMP process to expose the dielectric layer 26 under the sacrificial layer 28 and then remove the sacrificial layer 28 and silicon nitride 20. However, it easily exhibits a problem of excess polishing and leads to low reliability and high costs. Aside from that, while removing the sacrificial layer 28 and silicon nitride 20 with acid solution, the acid solution easily permeats through a seam between the sacrificial layer 28 and the gate structure 24. This randomly occurring acid-corroded seam phenomenon is also called random bit failure.

SUMMARY OF INVENTION

It is therefore a primary objective of the present invention to provide a method of fabricating a stacked gate of flash memory, especially with a unique HTO film to reduce random bit failure caused by an acid-corroded seam to improve the reliability of the flash memory.

According to the preferred embodiment of the present invention, the method comprises the following steps:(1) providing a substrate that has a channel region and a bit line region on its surface; (2) forming a stacked layer on the substrate in the channel region. The stacked layer comprises a polysilicon layer and a sacrificial layer formed atop the polysilicon layer; (3) oxidizing the stacked layer to create an HTO film on the surface of the polysilicon layer and the surface of the sacrificial layer; (4) depositing a dielectric layer over the HTO film to cover the channel region and the bit line region. The top surface of the dielectric layer on the surface of the substrate is above the top surface of the polysilicon layer and below the top surface of the sacrificial layer; (5) partially removing the dielectric layer and the HTO layer to expose portions of the sacrificial layer; and (6) completely removing the sacrificial layer.

It is an advantage that the present invention reinforces an interface between the dielectric layer and the polysilicon layer to prevent acid-corroded seams being formed during the acid solution dipping process to reduce random bit failure. In addition, when compared with the needed step of performing a CMP process and an additional sacrificial layer in the prior art, the present invention dips the nitride silicon layer directly. The present invention method simplifies the process and improves the reliability of flash memory.

These and other objects of the present invention will no doubt become obvious to those of ordinary skilled in the art after having read the following detailed description of the preferred embodiment that is illustrated in the various figures and drawings.

DETAILED DESCRIPTION

A high-GCR flash memory with an HTO film formed according to the preferred embodiment of the present invention is here described in detail.

Figure 8:
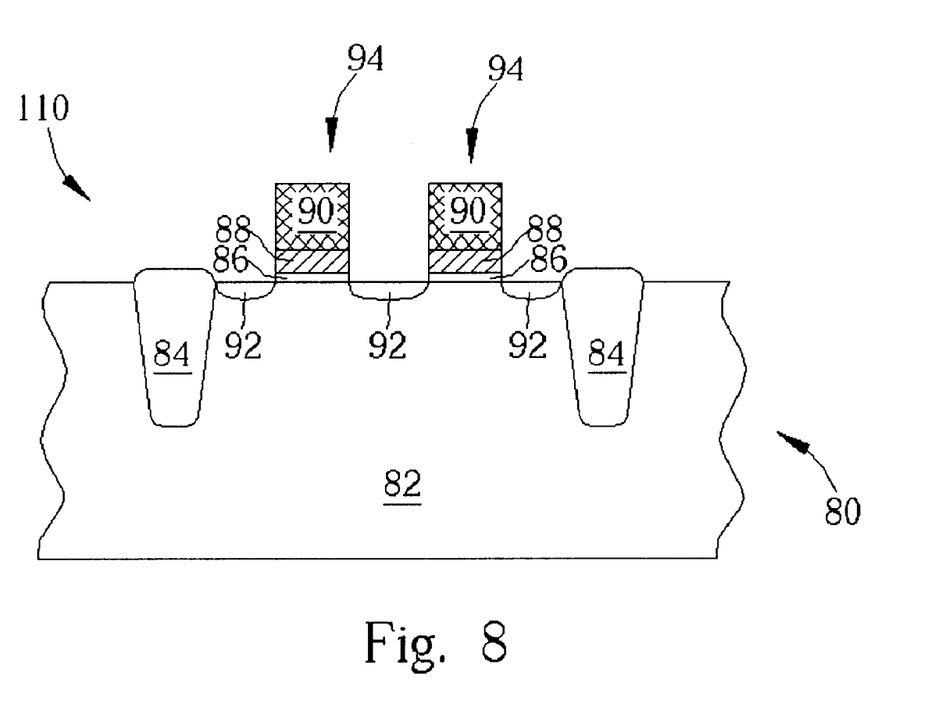
FIG. 8 to FIG. 12 are cross-sectional diagrams of forming a high-GCR flash memory according to the present invention.

Please refer to FIG. 8 to FIG. 12. FIG. 8 to FIG. 12 are schematic diagrams showing a preferred embodiment of fabricating a high-GCR flash memory according to the present invention. As shown in FIG. 8, a semiconductor wafer 80 comprising a silicon substrate 82 is first provided. An active area, isolated by a shallow trench isolation region 84, is positioned on the silicon substrate 82. Two gate structures 94 are formed within the active area. Each gate structure 94 comprises a gate oxide layer 86 formed on the silicon substrate 82, a polysilicon layer (PL1) layer 88, which is composed of CVD-polysilicon, positioned on the gate oxide layer 86, and a silicon nitride sacrificial layer 90 positioned atop the PL1 layer 88. After the formation of the gate structures 94, an ion implantation process utilizing arsenic ions is performed on the surface of the substrate 82 outside the gate structure 94 to form a doped region 92. The doped region 92 serves as a buried source.(BS) or a buried drain (BD) of the flash memory, or a so-called bit line area. Optionally, rapid thermal processing (RTP) is thereafter used to activate the doping region 92.

In the preferred embodiment of the present invention, the silicon substrate 82 is a P-type single crystal silicon substrate with a <100>crystalline orientation. Alternatively, the semiconductor substrate may be a silicon-on-insulator (SOI) substrate, an epitaxy silicon substrate, or any other silicon substrate with various lattice structures. Preferably, the gate oxide layer 86 has a thickness of about 90 to 120 angstroms, more preferably 95 angstroms. The PL1 layer 88 has a thickness of about 1000 angstroms. The sacrificial layer 90 has a thickness of about 1800 to 1950 angstroms, preferably 1925 angstroms. The sacrificial layer 90 may be formed by a chemical vapor deposition (CVD) method, such as a low pressure CVD method, in a $SiH_2Cl_2/NH_3$ system, at a temperature of about 750° C. The PL1 layer 88 is deposited in a $SiH_4$ ambient at a temperature of about 620° C. Generally, the after-etch-inspect critical dimension (AEICD) of the PL1 layer 88, i.e. floating gate channel length, is about 0.34 micrometers. The arsenic ion implantation process is performed with an energy of about 50 KeV and dosage of about $1 \times 10^{15}$ dopants/cm$^2$.

Figure 9:
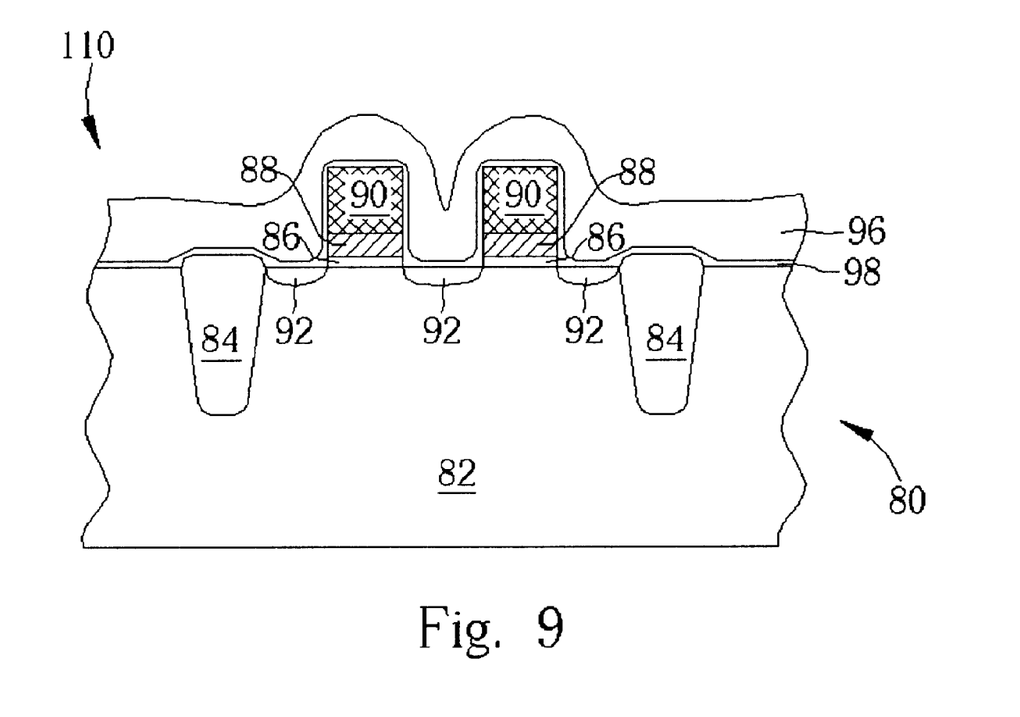

As shown in FIG. 9, a high temperature oxidation process is performed to form a HTO (high temperature oxide) film 98 on the surface of the silicon nitride sacrificial layer 90, on the PL1 layer 88, and on the silicon substrate 82 surface. Preferably, the thickness of the HTO film 98 is about 80 to 300 angstroms, more preferably between 100 to 150 angstroms. A high-density plasma CVD (HDPCVD) process is thereafter performed to deposit a 2000 to 3000 angstrom thick HDP oxide layer 96 over the HTO film 98. The HDP oxide layer 96 covers the channel regions and the bit line regions of the active area. The top surface of the HDP oxide layer 96 within the bit line region 92 is above the top surface of the PL1 layer 88 and below the top surface of the sacrificial layer 90.

In the preferred embodiment of the present invention, the high temperature oxidation process is performed at the temperature about 700 to 850° C., with the chamber pressure below 1 Torr. And, the HTO film 98 is formed in a $N_2O/SiCl_2H_2$ system with a total gas flow-rate (TGF) of about 0.3:0.15 SLM (standard liters per minute).

Figure 10:
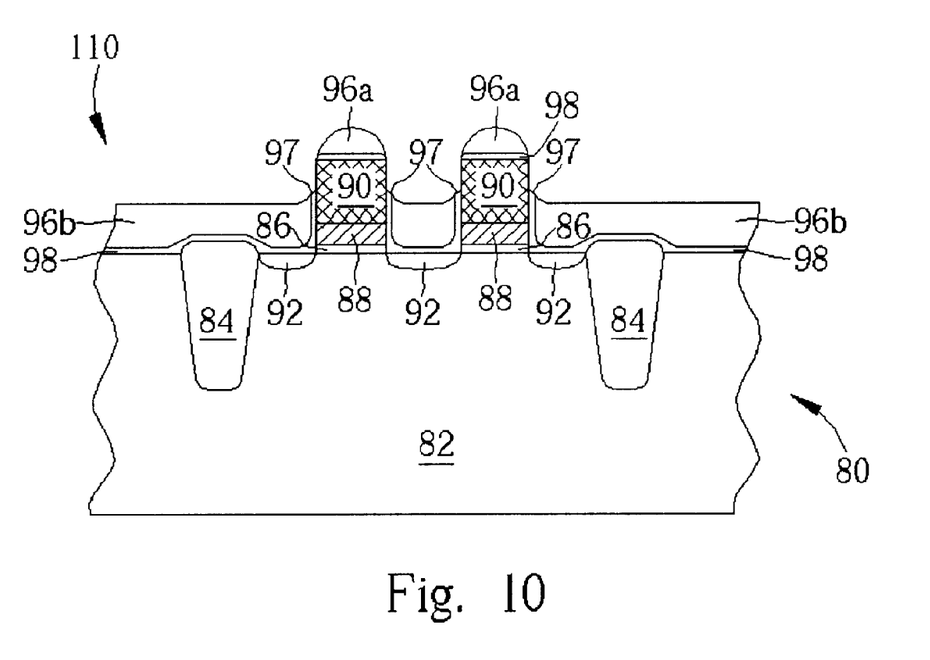

As shown in FIG. 10, a wet etching process using a DHF (diluted HF) solution or a BOE (buffered oxide etcher) solution as an etchant is performed to etch away a portion of the HDP oxide layer 96 and the HTO film 98 to expose the sacrificial layer 90. In the preferred embodiment, the removed thickness of the HDP oxide layer 96 is about 650 to 900 angstroms, preferably about 700 angstroms. At this point, the original HDP oxide layer 96 is now divided into two discontinuous parts: a first HDP oxide layer 96a and a second HDP oxide layer 96b. The first HDP oxide layer 96a is on the sacrificial layer 90 and will be removed in the subsequent processes, while the second HDP oxide layer 96b is located adjacent to the gate structures 94. Notably, the HTO film 98 reinforces the interface between the second HDP oxide layer 96b and the PL1 layer 88 so as to prevent the acid-corroded seam phenomenon caused by the use of the DHF solution.

Figure 11:
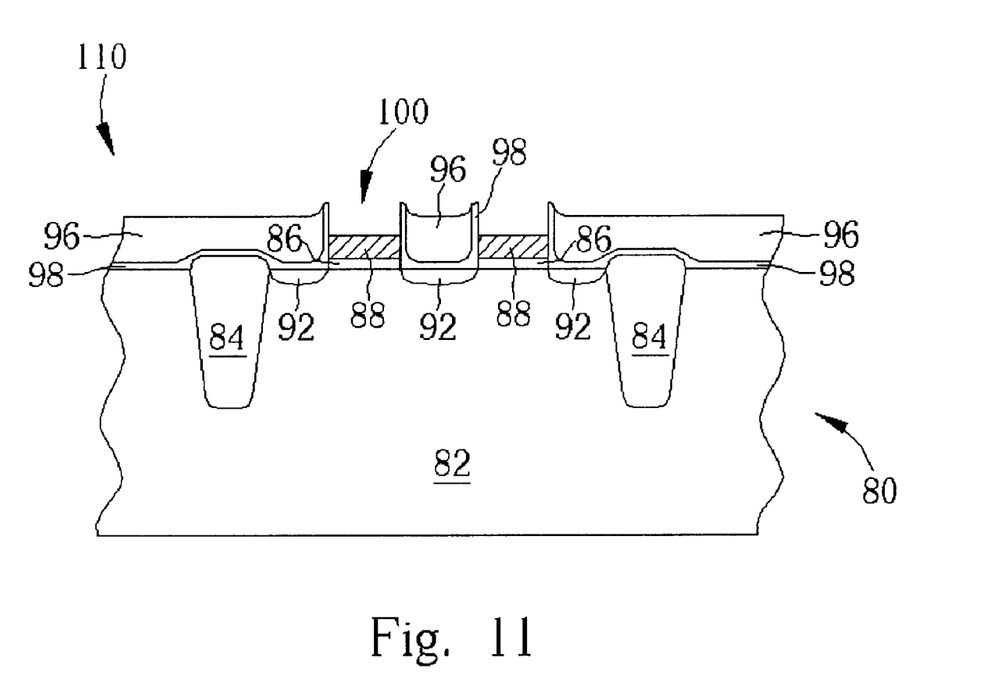

As shown in FIG. 11, the sacrificial layer 90 is then removed by using a method known in the art, such as a heated phosphoric acid solution. At the same time, the first HDP oxide layer 96a is also removed. A protrusion structure 97 of the second HDP oxide layer 96b is created near the PL1 layer after the removal of the sacrificial layer 90 and the first HDP oxide layer 96a. The protrusion structure 97 can improve the GCR with a gain of about 60% to 75%. An increased coupling ratio can be very beneficial in reducing the required operational voltage of a flash memory cell.

Figure 12:
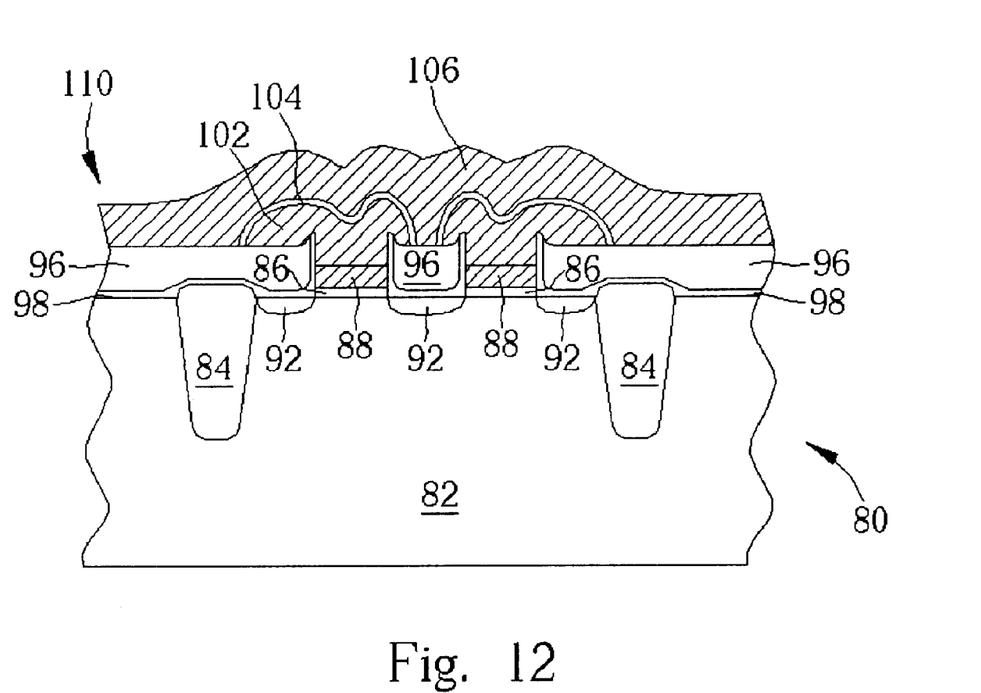

As shown in FIG. 12, a floating gate is completed by forming a polysilicon layer 102 over the PL1 layer 88. After that, a dielectric layer 104 is formed on the surface of the floating gate. The dielectric layer 104 is typically formed of an ONO structure which comprises a first oxide layer (not shown), a nitride layer (not shown) positioned on the first oxide layer, and a second oxide layer (not shown) positioned on the nitride layer. The ONO dielectric layer 104 is formed by the ONO process, which is known in the art. A polysilicon layer 106 is then formed that serves as a control gate structure. The floating gate, the ONO dielectric layer and the control gate form the stacked-gate flash memory cell.

In comparison with the prior art method, using a sacrificial layer and then performing a CMP process to form a recess structure, the process of the present invention method is improved and simplified to omit the steps of forming the sacrificial layer and performing the CMP process, as a result of utilizing the added HTO film. Additionally, the HTO film reinforces the interface between the dielectric layer and the polysilicon layer so as to prevent acid penetration and acid-corroded seams being formed during the acid solution dipping process. Thus, random bit failures are reduced and the reliability of flash memory is improved.

Those skilled in the art will readily observe that numerous modifications and alterations of the method may be made while retaining the teachings of the invention. Accordingly, the above disclosure should be construed as limited only by the metes and bounds of the appended claims.

What is claimed is:

1. A method for improving the reliability of flash memories, the method comprising:

forming a stacked layer on a substrate, wherein the stacked layer comprises a polysilicon layer and a sacrificial layer formed atop the polysilicon layer;

forming a HTO (high temperature oxide) film to cover the surface of the stacked layer and the substrate;

depositing a dielectric layer on the HTO film;

partially removing the dielectric layer and the HTO film to expose parts of the sacrificial layer while a part of the HTO film remains adjacent to the sidewall of the polysilicon layer; and completely removing the sacrificial layer;

wherein the HTO film adjacent to the sidewall of the polysilicon layer reinforces the interface between the dielectric layer and the polysilicon layer to prevent acid-corroded seams being formed.

2. The method of claim 1 wherein the dielectric layer is a high density plasma (HDP) oxide layer.

3. The method of claim 1 wherein the substrate further comprises two doped areas in the surface adjacent to the two sides of the polysilicon layer, the doped areas serving as a buried source (BS) or a buried drain (BD) for the flash memory.

4. The method of claim 1 wherein the sacrificial layer is composed of silicon nitride.

5. The method of claim 1 wherein the dielectric layer and the HTO film is partially removed by a wet etching process with a DHF (diluted HF) solution or a BOE (buffered oxide etcher) solution.

6. The method of claim 1 wherein the sacrificial layer is stripped by a hot phosphoric acid solution.

7. The method of claim 1 wherein the method further comprises at least one acid solution dipping process in which a DHF solution is utilized, the HTO film reinforcing the interface between the dielectric layer and the polysilicon layer to prevent acid-corroded seams being formed during the acid solution dipping process.

* * * * *